US011854791B2

(12) United States Patent
Wang

(10) Patent No.: US 11,854,791 B2
(45) Date of Patent: Dec. 26, 2023

(54) METAL SOURCE/DRAIN FEATURES

(71) Applicant: Taiwan Semiconductor Manufacturing Co., Ltd., Hsin-Chu (TW)

(72) Inventor: Pei-Yu Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/811,193

(22) Filed: Jul. 7, 2022

(65) Prior Publication Data

US 2022/0352339 A1 Nov. 3, 2022

Related U.S. Application Data

(62) Division of application No. 16/836,320, filed on Mar. 31, 2020, now Pat. No. 11,424,338.

(51) Int. Cl.
*H01L 29/45* (2006.01)
*H01L 21/02* (2006.01)
*H01L 21/285* (2006.01)
*H01L 21/311* (2006.01)
*H01L 29/06* (2006.01)
*H01L 29/423* (2006.01)
*H01L 29/66* (2006.01)
*H01L 29/786* (2006.01)

(52) U.S. Cl.
CPC ...... *H01L 29/458* (2013.01); *H01L 21/02236* (2013.01); *H01L 21/02532* (2013.01); *H01L 21/02603* (2013.01); *H01L 21/28518* (2013.01); *H01L 21/31111* (2013.01); *H01L 29/0673* (2013.01); *H01L 29/42392* (2013.01); *H01L 29/66553* (2013.01); *H01L 29/66742* (2013.01); *H01L 29/78618* (2013.01); *H01L 29/78696* (2013.01)

(58) Field of Classification Search
CPC ................ B82Y 10/00; H01L 29/0653; H01L 21/02532; H01L 21/02112; H01L 29/0847
See application file for complete search history.

(56) References Cited

U.S. PATENT DOCUMENTS

| 5,156,994 A | 10/1992 | Mosiehi |
| 9,455,331 B1 | 9/2016 | Cai |
| 9,818,872 B2 | 11/2017 | Ching et al. |

(Continued)

FOREIGN PATENT DOCUMENTS

| KR | 20040029582 A | 4/2004 |
| KR | 20180113118 A | 10/2018 |

(Continued)

*Primary Examiner* — Brian Turner
(74) *Attorney, Agent, or Firm* — HAYNES AND BOONE, LLP

(57) ABSTRACT

A semiconductor device according to the present disclosure includes a vertical stack of channel members, a gate structure over and around the vertical stack of channel members, and a first source/drain feature and a second source/drain feature. Each of the vertical stack of channel members extends along a first direction between the first source/drain feature and the second source/drain feature. Each of the vertical stack of channel members is spaced apart from the first source/drain feature by a silicide feature.

20 Claims, 12 Drawing Sheets

(56) References Cited

U.S. PATENT DOCUMENTS

| | | | |
|---|---|---|---|
| 9,887,269 | B2 | 2/2018 | Ching et al. |
| 9,899,398 | B1 | 2/2018 | Colinge et al. |
| 10,032,627 | B2 | 7/2018 | Lee et al. |
| 10,109,721 | B2 | 10/2018 | Lin et al. |
| 10,157,799 | B2 | 12/2018 | Ching et al. |
| 10,199,502 | B2 | 2/2019 | Huang et al. |
| 10,290,546 | B2 | 5/2019 | Chiang et al. |
| 10,475,902 | B2 | 11/2019 | Lee et al. |
| 2004/0063286 | A1 | 4/2004 | Kim et al. |
| 2005/0277275 | A1 | 12/2005 | Jawarani |
| 2008/0128760 | A1 | 6/2008 | Jun |
| 2011/0133165 | A1* | 6/2011 | Bangsaruntip ........ H01L 29/775 438/151 |
| 2015/0137181 | A1 | 5/2015 | Basker |
| 2018/0090582 | A1 | 3/2018 | Adusumilli |
| 2018/0122646 | A1 | 5/2018 | Adusumilli |
| 2018/0175036 | A1 | 6/2018 | Ching et al. |
| 2018/0294331 | A1 | 10/2018 | Cho et al. |
| 2018/0342596 | A1 | 11/2018 | Lee et al. |
| 2019/0067120 | A1 | 2/2019 | Ching |
| 2019/0067417 | A1 | 2/2019 | Ching |
| 2019/0103317 | A1 | 4/2019 | Yu et al. |
| 2019/0181224 | A1 | 6/2019 | Zhang et al. |
| 2020/0365586 | A1 | 11/2020 | Shin |

FOREIGN PATENT DOCUMENTS

| | | |
|---|---|---|
| KR | 20180129604 A | 12/2018 |
| KR | 20190038282 A | 4/2019 |

\* cited by examiner

METAL SOURCE/DRAIN FEATURES

PRIORITY DATA

This application is a divisional application of U.S. patent application Ser. No. 16/836,320, filed Mar. 31, 2020, which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanostructures (which extend horizontally, thereby providing horizontally-oriented channels) that are vertically stacked.

The shrunken dimensions also increase contact resistance to epitaxial source/drain features in multi-gate devices. Although conventional multi-gate devices have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
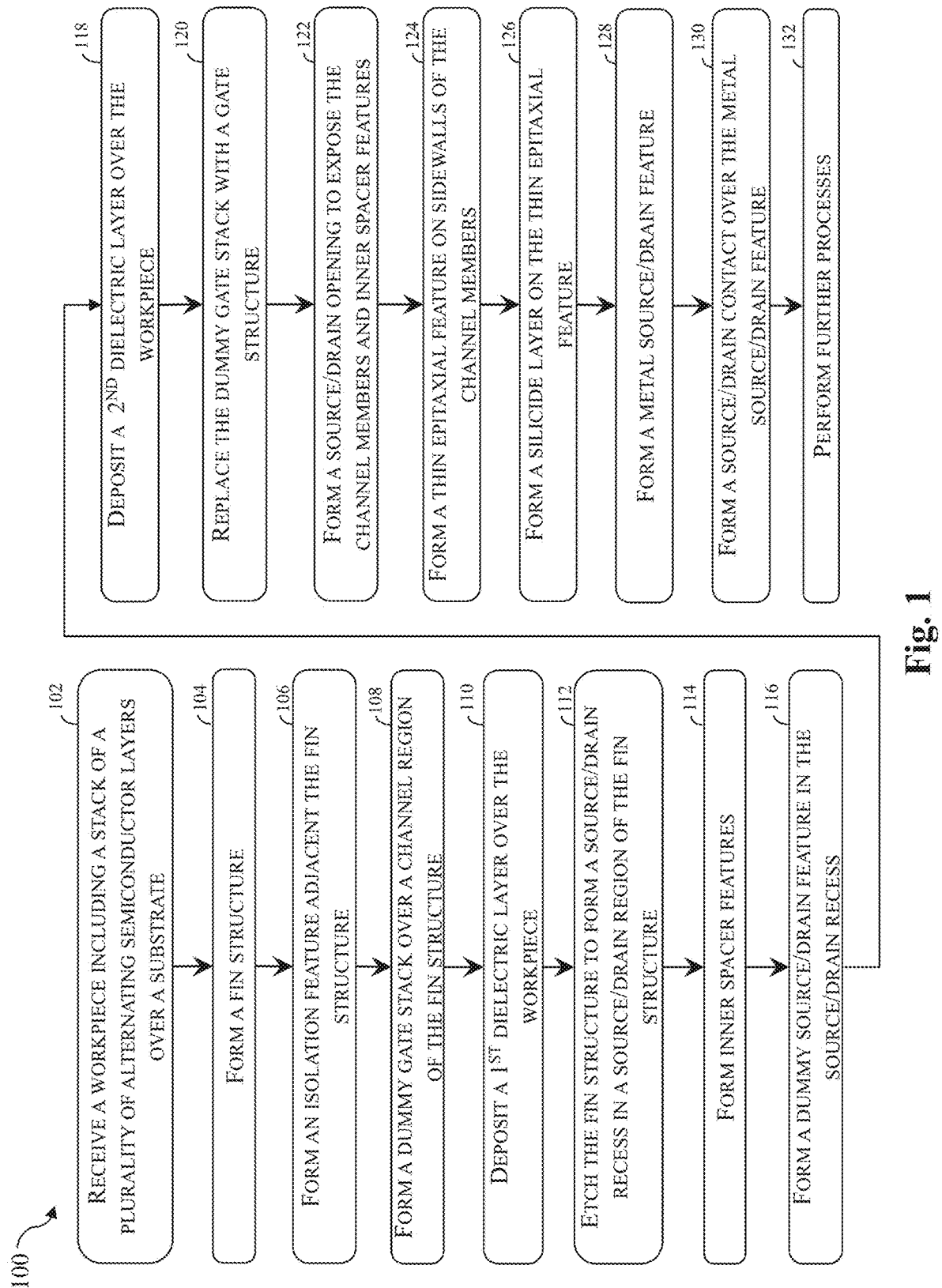
FIG. 1 illustrates a flow chart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nanometer (nm) to 5.5 nm.

The present disclosure is generally related to multi-gate transistors and fabrication methods of the same, and more particularly to formation of a thin epitaxial layer to maximize current conduction through metal source/drain feature that is more conductive than conventional epitaxial source/drain features.

Multi-gate transistors include those transistors whose gate structures are formed on at least two-sides of a channel region. These multi-gate devices may include a p-type metal-oxide-semiconductor device or an n-type metal-oxide-semiconductor device. Examples of multi-gate transistors include FinFETs, on account of their fin-like structure and gate-all-around (GAA) devices. A GAA device includes any device that has its gate structure, or portion thereof, formed on 4-sides of a channel region (e.g., surrounding a portion of a channel region). Embodiments of the present disclosure may have channel regions disposed in nanowire channel(s), bar-shaped channel(s), nanosheet channel(s), nanostructure channel(s), column-shaped channel(s), post-shaped channel(s), and/or other suitable channel configurations. Devices according to the present disclosure may have one or more channel members (e.g., nanowires, nanosheets, nanostructures) associated with a single, contiguous gate structure. However, one of ordinary skill would recognize that the teachings in the present disclosure may be applicable to a single channel (e.g., single channel member, single nanowire, single nanosheet, single nanostructure) or any number of channels. One of ordinary skill in art may recognize other examples of semiconductor devices that may benefit from aspects of the present disclosure.

Conventionally, epitaxial source/drain features have been formed over source/drain regions of multi-gate devices to interface with channel members. Epitaxial source/drain features are formed into source/drain openings (or source/drain trenches) that are formed into source/drain regions of an active region. A suitable epitaxial growth process is then used to deposit the epitaxial source/drain feature in the source/drain openings. The epitaxial material for the epitaxial source/drain feature grows from channel member surfaces that are exposed in the source/drain opening until the source/drain opening is filled. Due to the moderate electrical conductivity of epitaxial source/drain feature, epitaxial source/drain feature may exhibit less-than-desirable conductivity as its dimensions continue to shrink.

The present disclosure provides embodiments where only a thin epitaxial layer is formed on exposed channel member surfaces in source/drain openings, allowing a metal source/drain feature to be filled in the source/drain openings. By replacing a substantial portion of the epitaxial source/drain feature with the metal source/drain feature, the source/drain feature of the present disclosure possesses reduced contact resistance. To form the metal source/drain feature, methods of the present disclosure form a dummy epitaxial feature in the source/drain opening to serve as a placeholder before replacing a dummy gate stack with a functional gate structure. The dummy epitaxial feature is then removed to expose channel member surfaces in source/drain openings. A thin epitaxial layer is then grown on the exposed channel member surface without filling up the source/drain openings. A metal silicide layer and a metal source/drain feature are then deposited into the remainder of the source/drain openings.

The various aspects of the present disclosure will now be described in more detail with reference to the figures. Illustrated in FIG. 1 is a method 100 of forming a semiconductor device from a workpiece according to embodiments of the present disclosure. Method 100 is merely an example is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIGS. 2-11, which are fragmentary cross-sectional views of the semiconductor device at different stages of fabrication according to embodiments of the method 100 in FIG. 1.

Figure 2:
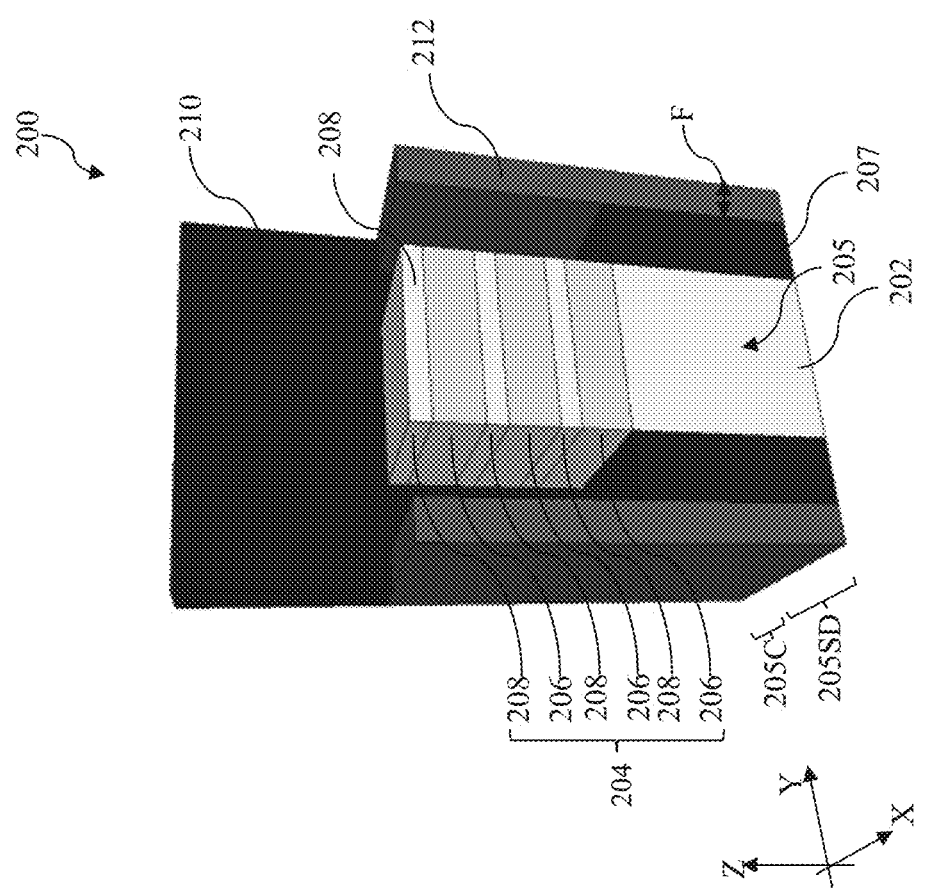
FIGS. 2-12 illustrate fragmentary cross-sectional views of a workpiece during a fabrication process according to the method of FIG. 1, according to one or more aspects of the present disclosure.

Referring to FIGS. 1 and 2, method 100 includes a block 102 where a workpiece 200 is received. The workpiece 200 includes a stack 204 of a plurality of alternating semiconductor layers over a substrate 202. It is noted that because a semiconductor device is formed from the workpiece 200 at the conclusion of the process, the workpiece 200 may be referred to as a semiconductor device 200 as the context requires. The workpiece 200 includes a substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type transistors, p-type transistors). The suitable doping may include ion implantation of dopants and/or diffusion processes. The substrate 202 may have isolation features interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features. In an embodiment of the method 100, an anti-punch through (APT) implant is performed to form in a region underlying the channel region of a device for example, to prevent punch-through or unwanted diffusion.

The workpiece 200 includes a stack 204 of a plurality of alternating semiconductor layers over a substrate 202. The stack 204 includes first semiconductor layers 206 and second semiconductor layers 208 stacked vertically (e.g., along the z-direction) in an interleaving or alternating configuration from a surface of substrate 202. In some embodiments, the first semiconductor layers 206 and second semiconductor layers 208 are epitaxially grown in the depicted interleaving and alternating configuration. In such embodiments, the first semiconductor layers 206 and second semiconductor layers 208 may also be referred to as first epitaxial layers 206 and second epitaxial layers 208. In some embodiments, epitaxial growth of the first epitaxial layers 206 and the second epitaxial layers 208 may be deposited by a molecular beam epitaxy (MBE) process, a chemical vapor deposition (CVD) process, a metalorganic chemical vapor deposition (MOCVD) process, other suitable epitaxial growth process, or combinations thereof. A composition of first epitaxial layers 206 is different than a composition of the second epitaxial layers 208 to achieve etching selectivity and/or different oxidation rates during subsequent processing. In some embodiments, the first epitaxial layers 206 have a first etch rate to an etchant and the second epitaxial layers 208 have a second etch rate to the etchant, where the second etch rate is less than the first etch rate. In some embodiments, the first epitaxial layers 206 have a first oxidation rate and the second epitaxial layers 208 have a second oxidation rate, where the second oxidation rate is less than the first oxidation rate. In the depicted embodiment, the first epitaxial layers 206 and the second epitaxial layers 208 include different materials, constituent atomic percentages, constituent weight percentages, thicknesses, and/or characteristics to achieve desired etching selectivity during an etching process, such as an etching process implemented to form suspended channel members in channel regions of a multi-gate device, such as a GAA device. For example, where the first epitaxial layers 206 include silicon germanium and the second epitaxial layers 208 include silicon, a silicon etch rate of the second epitaxial layers 208 is less than a silicon germanium etch rate of the first epitaxial layers 206. In one embodiment, the first epitaxial layers 206 includes silicon germanium (SiGe) and the second epitaxial layers 208 include silicon (Si). Alternatively, in some embodiments, either of the first and second epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some implementations, the first and second epitaxial layers 206 and 208 are substantially dopant-free (i.e., having an extrinsic dopant concentration from about 0 cm$^{-3}$ to about 1×10$^{17}$ cm$^{-3}$), where for example, no intentional doping is performed during the epitaxial growth process.

It is noted that three (3) layers of the first epitaxial layers 206 and three (3) layers of the second epitaxial layers 208 are alternately arranged as illustrated in FIG. 2, which is for illustrative purposes only and not intended to be limiting beyond what is specifically recited in the claims. It can be appreciated that any number of epitaxial layers can be formed in the stack 204. The number of layers depends on the desired number of channels members for the semiconductor device 200. In some embodiments, the number of second epitaxial layers 208 is between 2 and 10. In some embodiments, all of the first epitaxial layers 206 have a first thickness and all of the epitaxial layers 208 have a second thickness. The first thickness may be different from the second thickness. As described in more detail below, the second epitaxial layers 208 or parts thereof may serve as channel member(s) for a subsequently-formed multi-gate device and the second thickness is chosen based on device performance considerations. The first epitaxial layers 206 in channel regions(s) may eventually be removed and serve to define a vertical distance between adjacent channel region(s) for a subsequently-formed multi-gate device and the first thickness is chosen based on device performance considerations. Accordingly, the first epitaxial layers 206 may also be referred to as sacrificial layers 206, and the second epitaxial layers 208 may also be referred to as channel layers 208.

Referring to FIGS. 1 and 2, method 100 includes a block 104 where a fin structure 205 is formed. The fin structure 205 may include a substrate portion (i.e., a portion of substrate 202) and a semiconductor layer stack portion (i.e., a remaining portion of the stack 204). The fin structure 205 has a length defined in the X-direction, a width defined in the Y-direction, and a height defined in the Z-direction. In some implementations, a lithography and/or etching process is performed to pattern the stack 204 to form the fin structure 205. The lithography process can include forming a resist layer over the stack 204 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. As the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of the stack 204 using the patterned resist layer as an etch mask. In some embodiments, the patterned resist layer is formed over a hard mask layer disposed over the stack 204, a first etching process removes portions of the hard mask layer to form a patterned hard mask layer, and a second etching process removes portions of the stack 204 using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. Alternatively, the fin structure 205 may be formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning the stack 204. Further, in some embodiments, the exposure process can implement maskless lithography, electron-beam (e-beam) writing, and/or ion-beam writing for patterning the resist layer.

Referring to FIGS. 1 and 2, method 100 includes a block 106 where an isolation feature 207 adjacent the fin structure 205 is formed. In some embodiments, the isolation feature 207 is formed over and/or in substrate 202 to isolate the fin structure 205 from a neighboring fin structure (not shown) similar to the fin structure 205. In some implementations, the isolation features 207 may include different structures, such as shallow trench isolation (STI) structures. In these embodiments, the isolation feature 207 may be formed by depositing an insulator material over the workpiece 200 after forming the fin structure 205, planarizing the workpiece 200 by a chemical mechanical polishing (CMP), and etching back the insulator material layer to form the isolation feature 207. In these embodiments, the insulating material layer may include silicon oxide, silicon nitride, silicon oxynitride, fluorine-doped silicate glass (FSG), boron silicate glass (BSG) or phosphosilicate glass (PSG), a low-k dielectric, combinations thereof, and/or other suitable materials In some embodiments, dielectric fins 212 may be optionally formed over the workpiece 200 at block 104. In an example process flow to form dielectric fins, after the insulating material layer for the isolation feature 207 is deposited over the workpiece 200 and a top surface thereof is planarized, a slit that extend in parallel with the fin structure 205 is formed within the planarized insulating material layer. Therefore, a dielectric fin material is then deposited into the slit. The dielectric fin material is different from the insulating material layer that forms the isolation features 207. This allows the insulating material layer to be selectively etched in the isolation feature etch back process described above, leaving behind the dielectric fins 212 that rise above the isolation feature 207. In some embodiments, the dielectric fin material may include silicon nitride, silicon carbonitride, silicon carbide, aluminum oxide, zirconium oxide, or other suitable materials. In embodiments where dielectric fins are deployed, the fin structure 205 interposes between two dielectric fins 212 and serve to separate source/drain features of neighboring devices. The dielectric fins 212 may also be referred to as dummy fins 212 or hybrid fins 212. In some implementations, the dielectric fin 212 may have a fin thickness F between about 5 nm and about 10 nm. Such a fin thickness F range ensures sufficient mechanical strength of the dielectric fins 212 while the dielectric fins 212 do not take up too much space for formation of the source/drain features.

Referring to FIGS. 1 and 2, method 100 includes a block 108 where a dummy gate stack 210 is formed over a channel region 205C of the fin structure 205. In some embodiments, the dummy gate stack 210 extends along the Y direction over the channel region 205C of the fin structure 205 that extends lengthwise along the X direction. In embodiments where the dielectric fins 212 are formed, the dummy gate stack 210 is also formed over the dielectric fins 212, as shown in FIG. 2. In some embodiments, a gate replacement process (or gate-last process) is adopted where the dummy gate stack 210 serves as a placeholder for a functional gate structure and is to be removed and replaced by the functional gate structure. Other processes and configuration are possible. Besides the channel region 205C, the fin structure 205 also includes source/drain regions 205SD that are disposed on both sides of the channel region 205C along the X direction. Although not explicitly illustrated in FIG. 2, the dummy gate stack 210 may include a dummy dielectric layer over the channel region 205C, a dummy electrode layer over the dummy dielectric layer, and a gate-top hard mask over the dummy electrode layer. In some implementations, the dummy dielectric layer may be formed of silicon oxide and the dummy electrode layer may be formed of polysilicon. The gate-top hard mask may be a single layer and a multilayer. In some instances, the multilayer of the gate-top hard mask includes a silicon oxide layer over the dummy electrode layer and a silicon nitride layer over the silicon oxide layer. The formation of the dummy gate stack 210 may include various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

Figure 3:
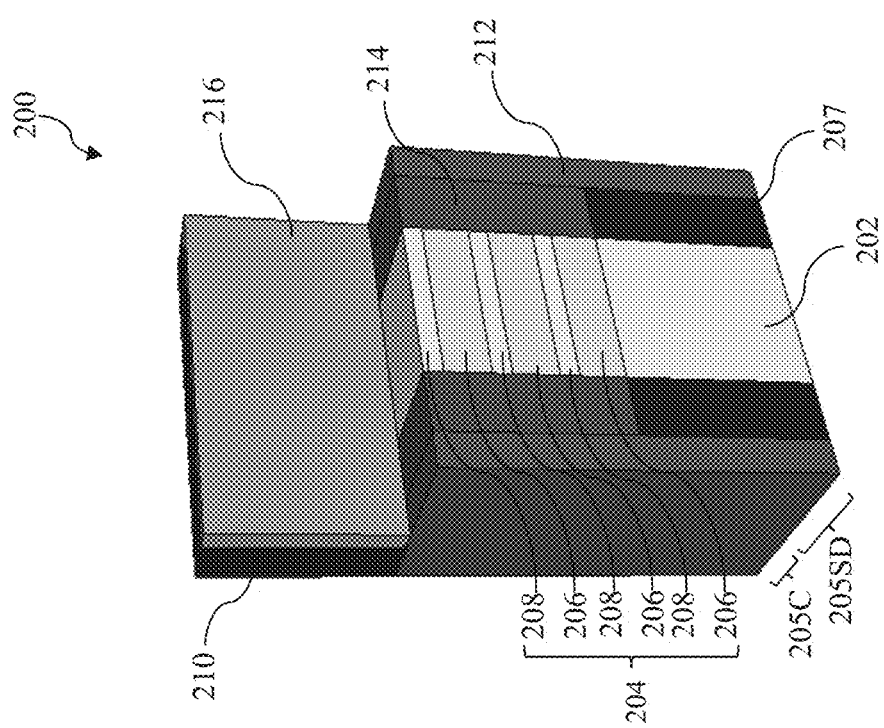

Referring to FIGS. 1 and 3, method 100 includes a block 110 where a first dielectric layer 214 is formed over the workpiece 200. In some embodiments, the first dielectric layer 214 may be deposited using subatmospheric CVD (SACVD), CVD, plasma-enhanced CVD (PECVD), ALD, or a suitable technique. The first dielectric layer 214 may include silicon oxide, hafnium silicide, silicon oxycarbide, aluminum oxide, zirconium silicide, aluminum oxynitride, zirconium oxide, hafnium oxide, hafnium zirconium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. As will be described below, the first dielectric layer 214 is selected such that a second dielectric layer (224, shown in FIG. 6) may be selectively etched without substantially damaging the first dielectric layer 214. In some implementations, after the deposition of the first dielectric layer 214, excess of the first dielectric layer 214 is etched back and removed from top surfaces of the dielectric fins 212 (if present), the fin structure 205, and the dummy gate stack 210, as illustrated in FIG. 3. In some embodiments, a gate spacer 216 is formed over sidewalls of the dummy gate stacks 210. In some embodiments, spacer material for forming the gate spacer 216 is deposited conformally over the workpiece 200, including over top surfaces and sidewalls of the dummy gate stack 210 to form a spacer material layer. The term "conformally" may be used herein for ease of description of a layer having substantially uniform thickness over various regions. The gate spacer 216 may have a single-layer construction or include multiple layers. The gate spacer 216 may be formed of the same material and using the same process as in the first dielectric layer 214. In one embodiment, the first dielectric layer 214 and the gate spacer 216 are formed simultaneously. That is, after the deposition of the first dielectric layer 214 over the workpiece 200, an anisotropic etch process may be performed to remove the excess first dielectric layer 214 over the top-facing surface, thereby forming both the gate spacer 216 on sidewalls of the dummy gate stack 210 and first dielectric layer 214 in the space defined by the isolation feature 207, the source/drain region 205SD, and the dummy gate stack 210.

Figure 4:
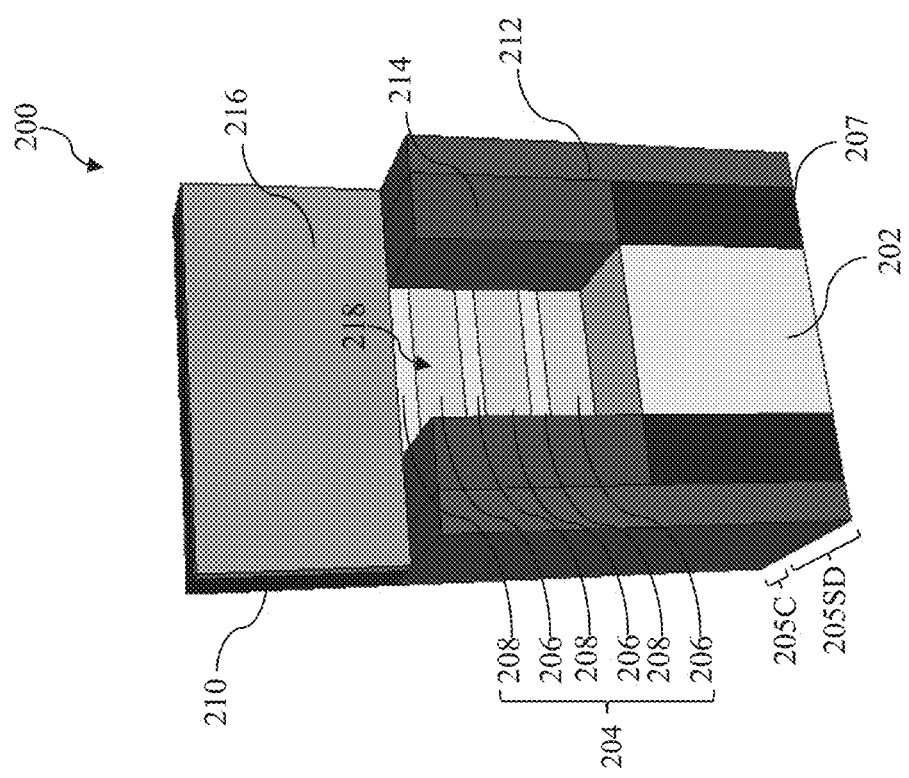

Referring to FIGS. 1 and 4, method 100 includes a block 112 where the fin structure 205 is etched to form a source/drain recess 218 in a source/drain region 205SD of the fin structure 205. At block 112, the source/drain region 205SD of the fin structure 205 is selectively etched to form source/drain recess 218 without substantially etching the first dielectric layer 214, the gate spacer 216, and the dummy gate stack 210. The source/drain recess 218 may also be referred to as the source/drain trench 218. As illustrated in FIG. 4, sidewalls of the stack 204 in the channel region 205C are exposed in the source/drain recess 218. While not explicitly shown, a photolithography process and at least one hard mask may be used to perform operations at block 112. In some embodiments, the portions of the fin structure 205 that are not covered by the dummy gate stack 210 and the gate spacer 216 are etched by a dry etch or a suitable etching process to form the source/drain recess 218. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 5:
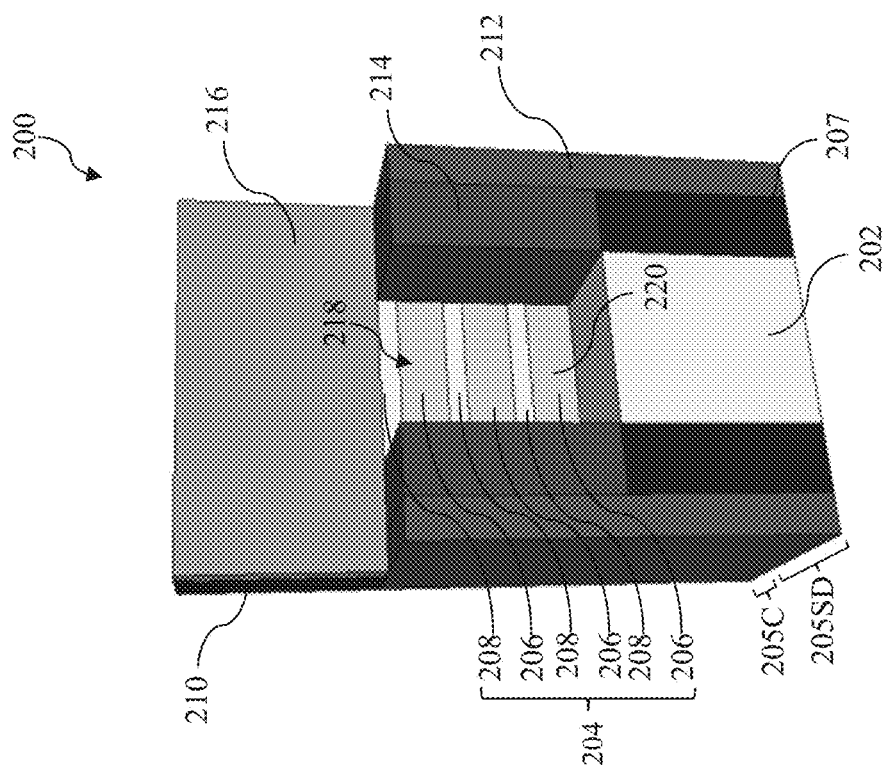

Referring to FIGS. 1 and 5, method 100 includes a block 114 where inner spacer features 220 are formed. To form the inner spacer features 220 shown in FIG. 5, the sacrificial layers 206 exposed in the source/drain recess 218 are selectively and partially recessed to form inner spacer recesses into the channel region 205C while the exposed channel layers 208 are substantially unetched. In an embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 206 are recessed is controlled by duration of the etching process. In some embodiments, the selective dry etching process may include use of one or more fluorine-based etchants, such as fluorine gas or hydrofluorocarbons. In some embodiments, the selective wet etching process may include a hydro fluoride (HF) or $NH_4OH$ etchant. The inner spacer material is then deposited over the workpiece 200 by CVD, PECVD, SACVD, ALD or other suitable method. Excess inner spacer material that is not disposed in the inner spacer recesses is removed in an etch back process. The inner spacer material may include silicon oxide, hafnium silicide, silicon oxycarbide, aluminum oxide, zirconium silicide, aluminum oxynitride, zirconium oxide, hafnium oxide, hafnium zirconium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride.

Figure 6:
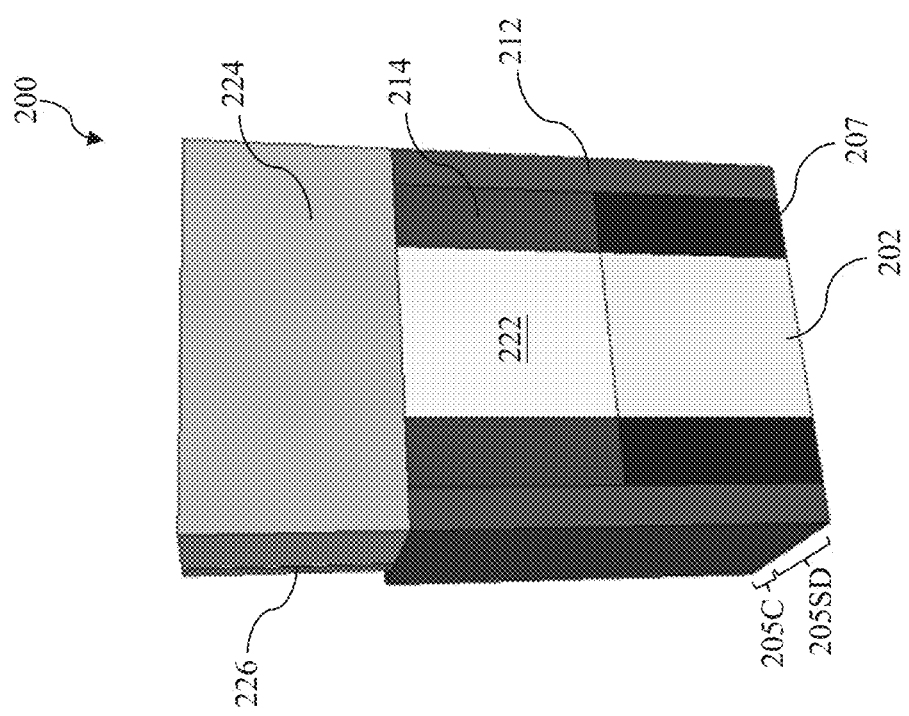

Referring to FIGS. 1 and 6, method 100 includes a block 116 where a dummy source/drain feature 222 is formed in the source/drain recess 218. Similar to the dummy gate stack 210 that serves as a placeholder for a functional gate structure, the dummy source/drain feature 222 serves as a placeholder for the functional source/drain features. That is, at least in some embodiments of the present disclosure, the dummy source/drain feature 222 is to be substantially removed in a subsequent process and is therefore not part of the final structure. The material for the dummy source/drain feature 222 is selected such that it may be selectively removed without damaging the first dielectric layer 214, the gate spacer 216, and the channel layers 208 in the channel region 205C. In some embodiments, the dummy source/drain feature 222 may be formed of a semiconductor material and may include silicon and germanium. In these embodiments, the germanium composition in the dummy source/drain feature 222 allows the dummy source/drain feature 222 to be selectively removed without damaging the first dielectric layer 214, the gate spacer 216, and the channel layers 208 in the channel region 205C. Additionally, in these embodiments, the dummy source/drain feature 222 is formed of SiGe and its germanium concentration is between about 20% and about 60%. While the dummy source/drain feature 222 may have a composition similar to that of the sacrificial layers 206, the sacrificial layers 206 are at this point protected by the inner spacer features 220 formed at block 114 and are not at risk. In some implementations, the dummy source/drain feature 222 may be doped with an n-type dopant, such as phosphorus (P) and arsenide (As), or a p-type dopant, such as boron (B). In some other embodiments, the dummy source/drain feature 222 may be dopant-free.

Referring to FIGS. 1 and 6, method 100 includes a block 118 where a second dielectric layer 224 is deposited over the workpiece. In some embodiments, the second dielectric layer 224 includes an interlayer dielectric (ILD) layer. In some embodiments, the second dielectric layer 224 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The second dielectric layer 224 may be deposited by a PECVD process or other suitable deposition technique. In some embodiments, after formation of the second dielectric layer 224, the workpiece 200 may be annealed to improve integrity of the second dielectric layer 224. In some embodiments, after depositing the second dielectric layer 224, a planarization process may be performed to remove excessive dielectric materials. For example, a planarization process includes a chemical mechanical planarization (CMP) process which removes portions of the second dielectric layer 224 overlying the dummy gate stack 210 and planarizes a top surface of the workpiece 200. In some embodiments, the CMP process also removes the gate-top hard mask and exposes the dummy electrode layer. Exposure of the dummy electrode layer allows the removal of the dummy gate stack 210 and release of the channel layers 208.

Referring to FIGS. 1 and 6, method 100 includes a block 120 where the dummy gate stack 210 is replaced with a functional gate structure 226. In some embodiments, operations at block 120 includes removal of the dummy gate stack 210 (including the dummy gate dielectric layer and dummy electrode layer), resulting in a gate trench over the channel region 205C. The removal of the dummy gate stack 210 may include one or more etching processes that are selective to the material in the dummy gate stack 210. For example, the removal of the dummy gate stack 210 may be performed using a selective wet etch, a selective dry etch, or a combination thereof that is selective to the dummy electrode layer. The sacrificial layers 206 and channel layers 208 in the channel region 205C are exposed in the gate trench. After the removal of the dummy gate stack 210, the method 100 may include operations to selectively remove the sacrificial layers 206 between the channel layers 208 in the channel region 205C. The selective removal of the sacrificial layers 206 releases the channel layers 208 to form channel members 208. It is noted that the same reference numeral 208 is used to denote channel members 208 for simplicity. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by ozone clean and then SiGeOx removed by an etchant such as $NH_4OH$.

After the channel members 208 are released, the functional gate structure 226 is then formed in the gate trench to wrap around each of the released channel members 208. In various embodiments, the functional gate structure 226 may include an interfacial layer, a high-K gate dielectric layer formed over the interfacial layer, and/or a gate electrode layer formed over the high-K gate dielectric layer. High-K gate dielectrics, as used and described herein, include dielectric materials having a high dielectric constant, for example, greater than that of thermal silicon oxide (~3.9). The gate electrode layer may include a metal, metal alloy, or metal silicide. Additionally, the formation of the functional gate structure 226 may include depositions to form various gate materials, one or more liner layers, and one or more CMP processes to remove excessive gate materials and thereby planarize a top surface of the workpiece 200. In some embodiments, the interfacial layer of the functional gate structure 226 may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer of the functional gate structure 226 may include a high-K dielectric layer such as hafnium oxide. Alternatively, the high-K gate dielectric layer of the functional gate structure 226 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

The gate electrode layer of the functional gate structure 226 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer of the functional gate structure 226 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer of the functional gate structure 226 may be formed by ALD, PVD, CVD, e-beam evaporation, or other suitable process. Further, the gate electrode layer may be formed separately for N-FET and P-FET transistors which may use different metal layers (e.g., for providing different n-type and p-type work function metal layers). In various embodiments, a CMP process may be performed to remove excessive metal from the gate electrode layer of the functional gate structure 226, and thereby provide a substantially planar top surface of the functional gate structure 226. The functional gate structure 226 includes portions that interpose channel members 208 in the channel region 205C.

Figure 7:
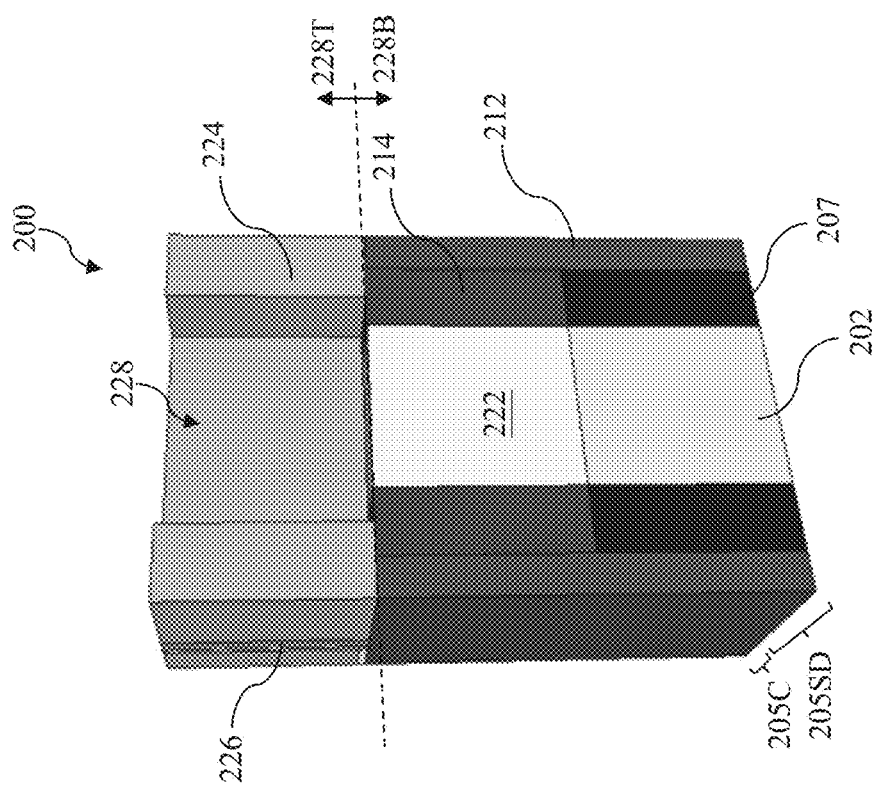
Figure 8:
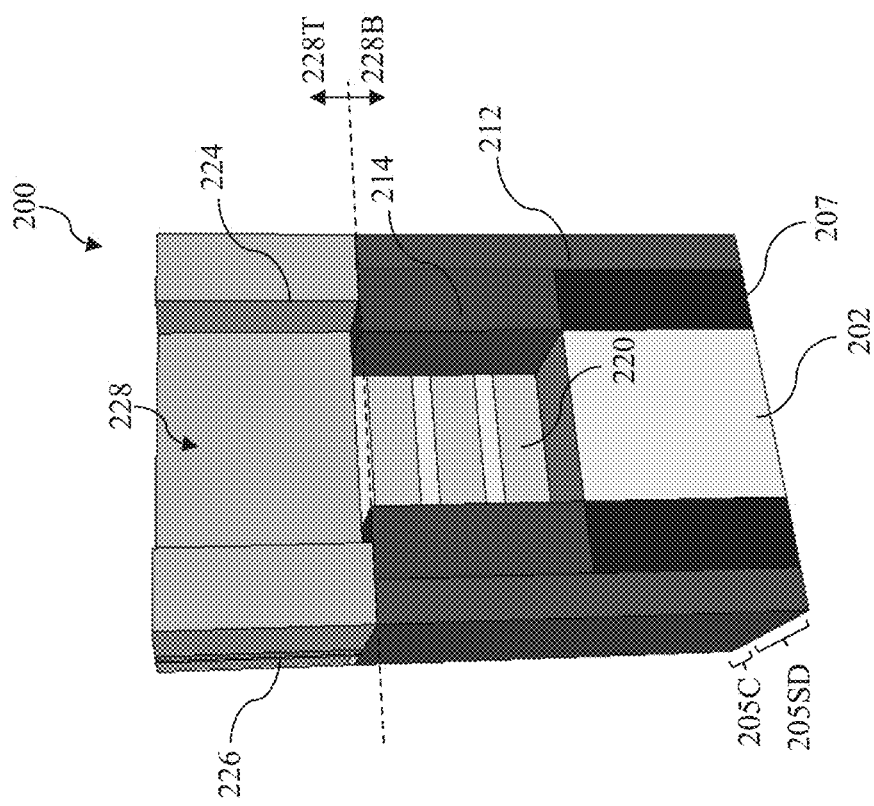

Referring to FIGS. 1, 7 and 8, method 100 includes a block 122 where a source/drain opening 228 is formed to expose the channel members 208 and inner spacer features 220. The source/drain opening 228 may include a top opening 228T and a bottom opening 228B. As shown in FIG. 8, the top opening 228T is formed when the second dielectric layer 224 is etched through using a patterned photoresist layer as an etch mask; and the bottom opening 228B is formed when the dummy source/drain feature 222 is selectively removed. In some embodiments, the top opening 228T and the bottom opening 228B are formed in separate etching processes at block 122. Referring first to FIG. 7, the second dielectric layer 224 is first etched to form the top opening 228T. Because the second dielectric layer 224 has a composition different from those of the first dielectric layer 214 and the dummy source/drain feature 222, the top opening 228T may be etched without substantially damaging the first dielectric layer 214 and the dummy source/drain feature 222. The formation of the top opening 228T exposes the dummy source/drain feature 222 and a portion of the first dielectric layer 214. Referring then to FIG. 8, the dummy source/drain feature 222 is then selectively removed to form the bottom opening 228B. In some embodiments where the dummy source/drain feature 222 includes silicon germanium, the removal of the dummy source/drain feature 222 may be performed using processes similar to those used to remove the sacrificial layers 206 at block 120.

Figure 9:
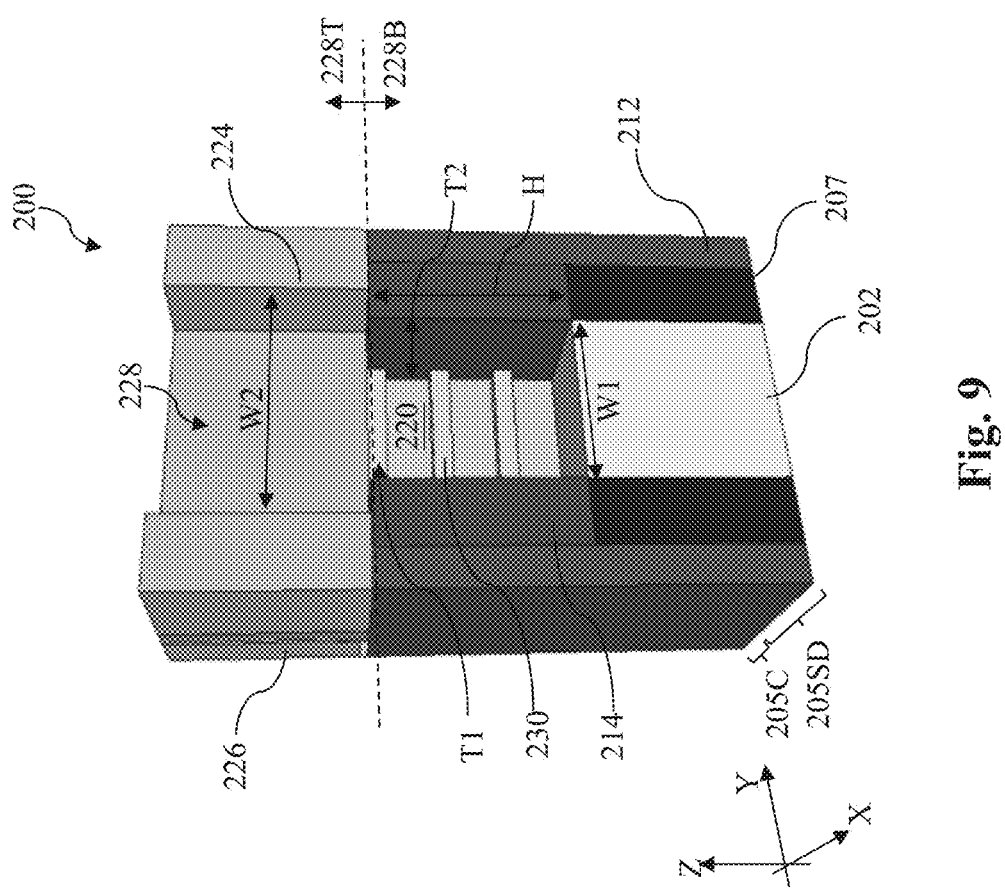

Referring to FIGS. 1 and 9, method 100 includes a block 124 where a thin epitaxial feature 230 on sidewalls of the channel members 208. As its name suggests, the thin epitaxial feature 230 is formed using an epitaxial growth process, such as vapor-phase epitaxy (VPE), ultra-high vacuum CVD (UHV-CVD), or molecular beam epitaxy (MBE). Because the epitaxial growth process is selective to semiconductor materials (e.g., silicon channel members 208) and is negligible on dielectric materials (e.g., inner spacer feature 220, the first dielectric layer 214, and the second dielectric layer 224), the thin epitaxial feature 230 is grown from the exposed side surfaces of the channel members 208 along the X direction. In some instances, the thin epitaxial feature 230 is formed to a first thickness T between about 3 nm and about 10 nm, including between about 5 nm and about 8 nm. As illustrated in FIG. 9, the bottom opening 228B has a first width W1 along the Y direction, a height H along the Z direction, and a second thickness T2 along the X direction. The top opening 228T has a second width W2 along the Y direction. In some instances, the first width W1 may be between about 20 nm and about 70 nm, the height H may be between about 40 nm and about 60 nm, the second thickness T2 may be between about 15 nm and about 25 nm, and the second width W2 may be between about 30 nm and about 70 nm. It can be seen that a would-be conventional epitaxial feature that substantially fills up the bottom opening 228B has the second thickness T2. The thin epitaxial feature 230 (with the first thickness T1 between about 3 nm and about 10 nm) is thinner than the would-be conventional epitaxial feature (with the second thickness T2 between about 15 nm and about 25 nm). In some instances, the would-be conventional epitaxial feature may be similar to dummy source/drain feature 222 in terms of compositions and dimensions.

Depending on the conductivity type of the semiconductor device 200, the thin epitaxial feature 230 may be n-type or p-type. An n-type thin epitaxial source/drain feature 230 may include Si, GaAs, GaAsP, SiP, or other suitable material. The n-type thin epitaxial source/drain feature 230 may be in-situ doped during the epitaxial process by introducing doping species including n-type dopants, such as phosphorus or arsenic; and/or other suitable dopants including combinations thereof. In an exemplary embodiment, an n-type thin epitaxial source/drain feature 230 in an n-type device may include SiP. A p-type thin epitaxial source/drain feature 230 may include Si, Ge, AlGaAs, SiGe, boron-doped SiGe, or other suitable material. The p-type thin epitaxial source/drain feature 230 may be in-situ doped during the epitaxial process by introducing doping species including p-type dopants, such as boron or $BF_2$, and/or other suitable dopants including combinations thereof. In an exemplary embodiment, a p-type thin epitaxial source/drain feature 230 in a p-type device include SiGeB. In some implementations, the epitaxial growth process for forming the thin epitaxial feature 230 may involve an elevated process temperature that may pose risks of damaging the functional gate structure 226. However, because the thin epitaxial feature 230 is thin and takes less time to form, such risks may be minimized.

Figure 10:
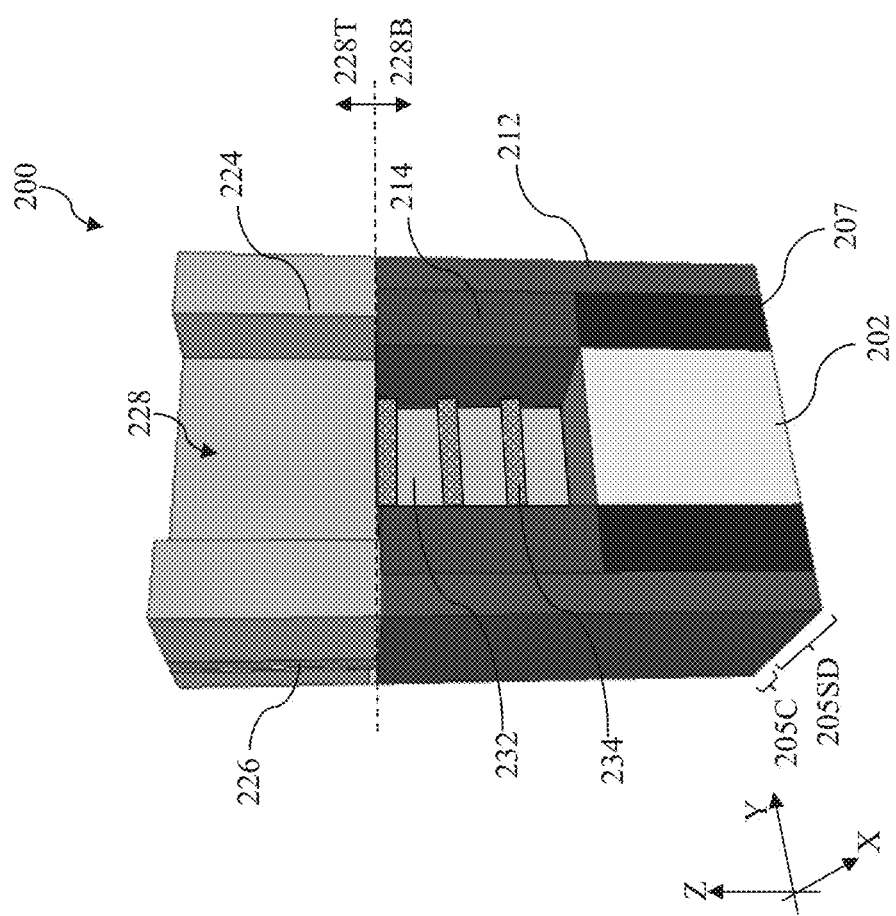

Referring to FIGS. 1 and 10, method 100 includes a block 126 where a silicide layer 234 is formed on the ultrathin epitaxial feature. In an example process, a metal layer 232 is deposited on surfaces of the thin epitaxial feature 230 and the inner spacer feature 220 and the workpiece 200 is annealed to bring about a silicidation reaction between the silicon in the thin epitaxial feature 230 and the metal layer 232 to form the silicide layer 234. In some implementations, the metal layer 232 may include titanium (Ti), nickel (Ni), cobalt (Co), tantalum (Ta), or tungsten (W). In one embodiment, the metal layer 232 may be formed of a metal species selected from titanium (Ti), nickel (Ni), and cobalt (Co). Because little or no silicide may be formed at the interface between the inner spacer features 220 and the metal layer 232, the metal layer 232 substantially maintains its composition and does not turn into metal silicide. As illustrated in FIG. 10, upon conclusion of the operations at block 126, the silicide layer 234 is disposed on the thin epitaxial feature 230 and the metal layer 232 is disposed on the inner spacer features 220. Due to the selective nature of the formation of the silicide layer 234, the silicide layer 234 is only present over the thin epitaxial features 230 that are spaced apart from one another along the Z direction the silicide layer 234 may also be regarded and referred to as silicide features 234, which are also spaced apart from one another along the Z direction. Depending on the composition of the thin epitaxial feature 230, the composition of the silicide layer 234 formed at block 126 may include metal silicide, metal germanide, metal galliumide, metal aluminide along with n-type dopants or p-type dopants. When the thin epitaxial feature 230 is n-type for use with an n-type semiconductor device, the silicide layer 234 may include titanium silicide, nickel silicide, cobalt silicide, tantalum silicide, tungsten silicide, titanium galliumide, nickel galliumide, cobalt galliumide, tantalum galliumide, tungsten galliumide, as well as d-type dopants phosphorus (P) or arsenide (As). When the thin epitaxial feature 230 is p-type for use with a p-type semiconductor device, the silicide layer 234 may include titanium silicide, nickel silicide, cobalt silicide, tantalum silicide, tungsten silicide, titanium germanide, nickel germanide, cobalt germanide, tantalum germanide, tungsten germanide, as well as p-type dopants boron (B) or aluminum (Al). In some instances, the silicide layer 234 may be formed of a metal silicide species selected from titanium silicide, nickel silicide, and cobalt silicide. In some alternative embodiments not separately illustrated, excess metal layer 232 that is not turned into the silicide layer 234 may be selectively removed. In those alternative embodiments, the metal layer 232 is not present in the final semiconductor device 200.

Figure 11:
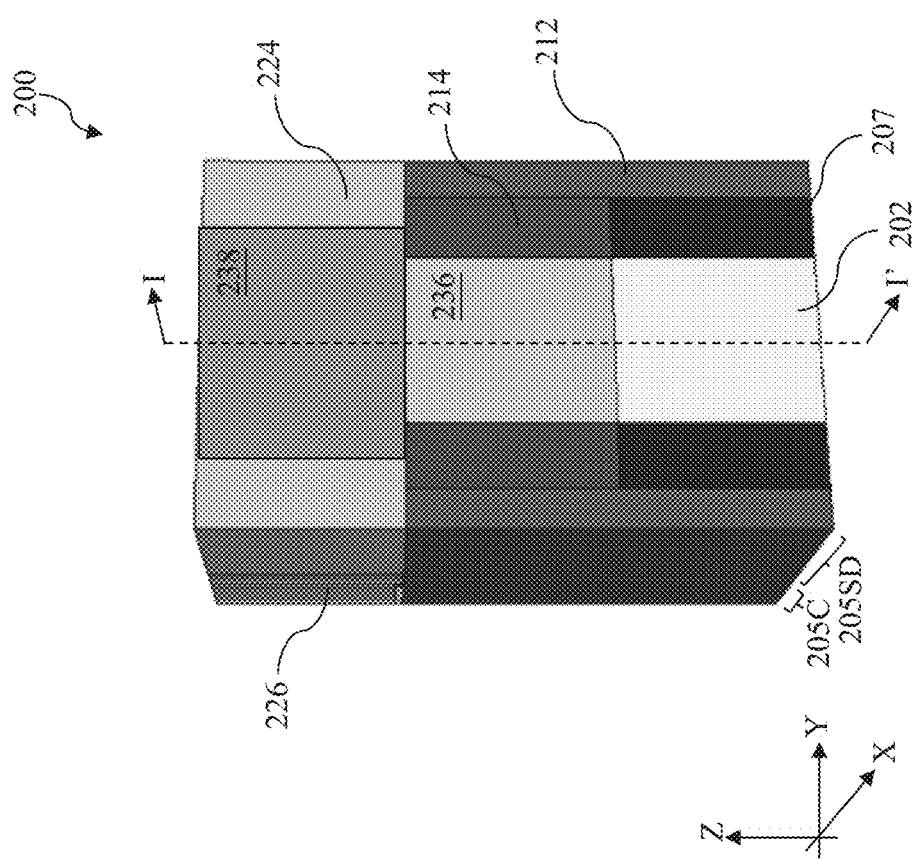

Referring to FIGS. 1 and 11, method 100 includes a block 128 where a metal source/drain feature 236 is formed. At block 128, the remainder of the bottom opening 228B (which is not occupied by the thin epitaxial feature 230, the metal layer 232, and the silicide layer 234) is filled with a metal material to form the metal source/drain feature 236. In some implementations, the metal material may be deposited using physical vapor deposition (PVD), CVD, or ALD and may be formed of cobalt (Co), ruthenium (Ru), or tungsten (W). As the metal source/drain feature 236 is formed of the metal material, it has an electrical conductivity greater than epitaxial features, however heavily they are doped with dopants. The implementation of the metal source/drain feature 236 therefore may largely reduce contact resistance.

Figure 12:
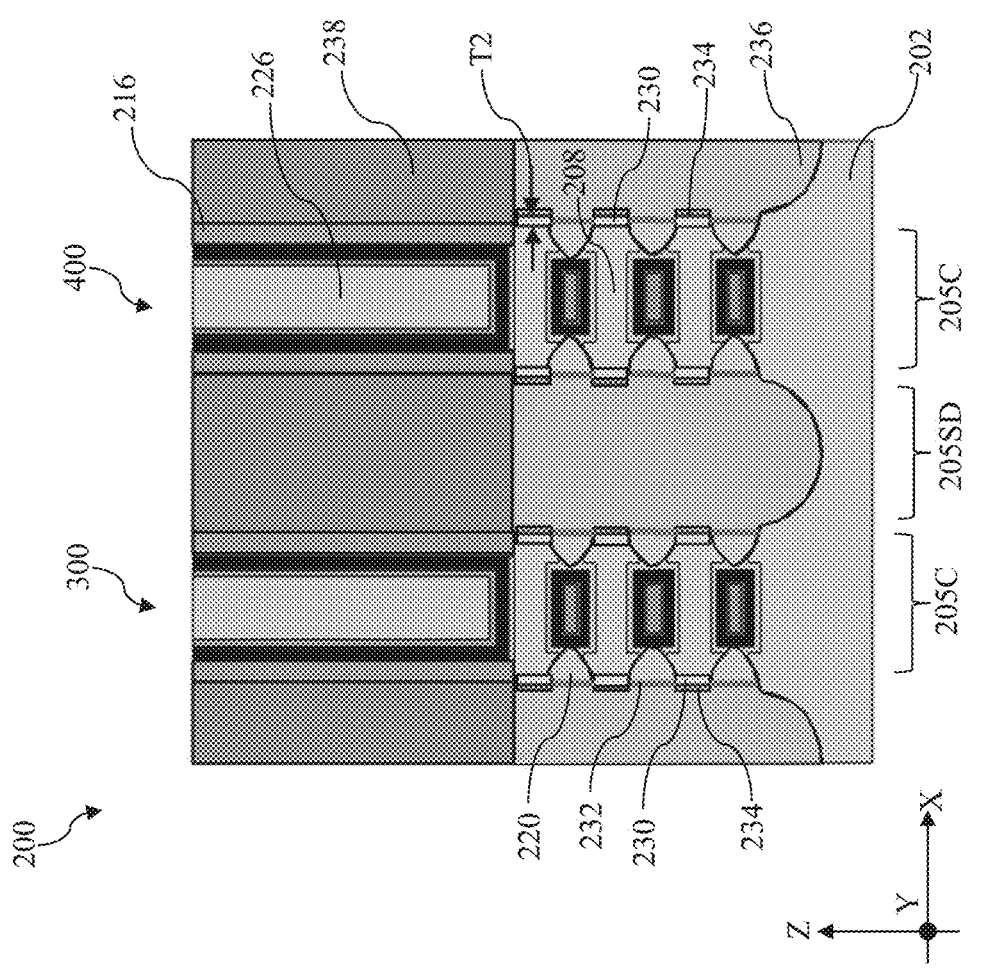

Referring to FIGS. 1, 11 and 12, method 100 includes a block 130 where a source/drain contact 238 is formed over the metal source/drain feature. In some embodiments, a metal material may be deposited in the top opening 228T to form the source/drain contact 238. In some embodiment, the source/drain contact 238 may be formed using a process and same metal material that are similar to those used to form the metal source/drain feature 236. In those embodiments, the source/drain contact 238 may be formed using PVD, CVD, or ALD and may be formed of cobalt, ruthenium, or tungsten. In one embodiment, the operations at blocks 128 and 130 may merge and the metal source/drain feature 236 and the source/drain contact 238 may be formed simultaneously. That is, in this embodiment, the metal material may be deposited into the bottom opening 228B and the top opening 228T to form both the metal source/drain feature 236 and the source/drain contact 238.

FIG. 12 illustrates a fragmentary cross-sectional view of the semiconductor device 200 along the cross section I-I' in FIG. 11. A first multi-gate transistor 300 and a second multi-gate transistor 400 are shown in the fragmentary cross-sectional view in FIG. 12. Each of the first multi-gate transistor 300 and the second multi-gate transistor 400 is a GAA transistor where the functional gate structure 226 wraps around each of the channel members 208 in the respective channel regions 205C of the first multi-gate transistor 300 and the second multi-gate transistor 400. When the metal source/drain feature 236, the silicide layer 234, and the thin epitaxial feature 230 are regarded collectively as a source/drain structure of a multi-gate transistor (e.g., the first multi-gate transistor 300 or the second multi-gate transistor 400), the thin epitaxial feature 230 functions as its interface with the channel members 208 and does not account for most of the volume of the source/drain structure. The silicide layer 234 functions to reduce the contact resistance at the interface between the thin epitaxial feature 230 and the metal source/drain feature 236. The metal source/drain feature 236, benefited from conductivity of the metal material, constitutes the majority of the volume of the source/drain structure and works to reduce the contact resistance along the conduction path between the channel members 208 to the source/drain contact 238. As shown in FIG. 12, the thin epitaxial feature 230 is disposed on side surfaces of the channel members 208 and extends substantially on a Y-Z plane with a normal direction along the X direction. The silicide layer 234 is disposed on the thin epitaxial feature 230 and extends substantially parallel to the thin epitaxial feature 230. Because the thin epitaxial features 230 are selectively grown from channel members 208 and the silicide layers 234 are selectively formed on the thin epitaxial features 230, they are vertically spaced apart from one another along the Z direction by spacing defined by the inner spacer features 220. The metal layer 232 is sandwiched between the inner spacer features 220 and the metal source/drain feature 236. In some implementations, a composition of the metal layer 232 may be different from that of the metal source/drain feature 236. For example, the metal layer 232 may include titanium (Ti), tantalum (Ta) or nickel (Ni) while the metal source/drain feature 236 may include cobalt (Co), ruthenium (Ru) or tungsten (W). In some other implementations, the metal layer 232 and the metal source/drain feature 236 may share the same metal. For example, both the metal layer 232 and the metal source/drain feature 236 may include cobalt (Co) or tungsten (W).

Referring to FIG. 1, method 100 includes a block 132 where further processes are formed. Such further processes may include formation of etch stop layers (ESL), further interlayer dielectric (ILD) layers, capping layers, self-aligned contact (SAC) dielectric features, and an interconnect structure. These further processes form connections or interconnections to the transistors in the semiconductor device 200.

Although not intended to be limiting, one or more embodiments of the present disclosure provide many benefits to a semiconductor device and the formation thereof. For example, embodiments of the present disclosure provide a metal source/drain feature that interfaces channel members in the channel region with a thin epitaxial feature and a silicide layer. Because the metal source/drain feature is formed of conductive metal material, rather than doped semiconductor materials, its implementation improves device performance by reducing contact resistance.

In one exemplary aspect, the present disclosure is directed to a semiconductor device. The semiconductor device includes a vertical stack of channel members, a gate structure over and around the vertical stack of channel members, and a first source/drain feature and a second source/drain feature. Each of the vertical stack of channel members extends along a first direction between the first source/drain feature and the second source/drain feature and each of the vertical stack of channel members is spaced apart from the first source/drain feature by a silicide feature.

In some embodiments, the first source/drain feature and the second source/drain feature include cobalt (Co), ruthenium (Ru), or tungsten (W). In some implementations, the silicide feature includes titanium silicide, nickel silicide, or cobalt silicide. In some implementations, the silicide feature is in direct contact with the first source/drain feature. In some embodiments, the semiconductor device further includes an epitaxial feature disposed between the silicide feature and each of the vertical stack of channel members. In some instances, the epitaxial feature includes a semiconductor material and the epitaxial feature includes a thickness along the first direction and the thickness is between about 3 nm and about 10 nm. In some embodiments, the semiconductor device may further include a first dielectric fin and a second dielectric fin. The first source/drain feature and the second source/drain feature are disposed between the first dielectric fin and the second dielectric fin along a second direction perpendicular to the first direction. In some instances, each of the first source/drain feature and the second source/drain feature is spaced apart from the first dielectric fin and the second dielectric fin by a dielectric layer and a composition of the dielectric layer is different from a composition of the first dielectric fin and the second dielectric fin.

In another exemplary aspect, the present disclosure is directed to a semiconductor device. The semiconductor device includes a plurality of channel members stacked along a first direction over a substrate, each of the plurality of channel members extending lengthwise along a second direction, a gate structure over and around the plurality of channel members, and a first source/drain feature and a second source/drain feature on the substrate. The plurality of channel members are disposed between the first source/drain feature and the second source/drain feature along the second direction and the first source/drain feature and the second source/drain feature include a metal.

In some embodiments, the metal includes cobalt (Co), ruthenium (Ru), or tungsten (W). In some implementations, the semiconductor device may further include a plurality of silicide features in contact with the first source/drain feature. The plurality of channel members is spaced apart from the first source/drain feature along the second direction by the plurality of silicide features and the plurality of silicide features are spaced apart from one another along the first direction. In some instances, the plurality of silicide features include titanium silicide, nickel silicide, or cobalt silicide. In some embodiments, the semiconductor device further include a plurality of epitaxial features in contact with the plurality of channel members. The plurality of channel members are spaced apart from the plurality of silicide features along the second direction by the plurality of epitaxial features. In some instances, the semiconductor device may further include a plurality of inner spacer features in contact with the first source/drain feature. The plurality of channel members are partially spaced apart from one another along the first direction by the plurality of inner spacer features.

In yet another exemplary aspect, the present disclosure is directed to a method of fabricating a semiconductor device. The method includes forming on a substrate a stack including a plurality of first semiconductor layers interleaved by a plurality of second semiconductor layers, forming a fin structure from the stack, etching a source/drain trench to expose sidewalls of the plurality of first semiconductor layers and the plurality of second semiconductor layers, selectively recessing the plurality of second semiconductor layers in the fin structure to form inner spacer recesses, forming inner spacer features in the inner spacer recesses, selectively depositing an epitaxial layer on the plurality of first semiconductor layers exposed in the source/drain trench, forming a metal silicide layer on the epitaxial layer, and depositing a source/drain feature in the source/drain trench such that the source/drain feature is in contact with the inner spacer features and the metal silicide layer.

In some embodiments, the method may further include after the etching of the source/drain trench, depositing a placeholder epitaxial feature in the source/drain trench, depositing an interlayer dielectric layer over the substrate, forming a source/drain contact opening to expose the placeholder epitaxial feature, and after forming the source/drain contact opening, removing the placeholder epitaxial feature in the source/drain trench. In some implementations, the placeholder epitaxial feature includes silicon and germanium. In some instances, the metal silicide layer includes titanium silicide, nickel silicide, or cobalt silicide. In some implementations, the source/drain feature includes cobalt (Co), ruthenium (Ru), or tungsten (W). in some instances, the selectively depositing of the epitaxial layer includes depositing the epitaxial layer to a thickness between about 3 nm and about 10 nm.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a workpiece comprising:
      a substrate,
      a first dielectric fin and a second dielectric fin disposed over the substrate and extending along a first direction,
      a fin-shaped structure disposed between the first dielectric fin and the second dielectric fin and extending along the first direction, wherein the fin-shaped structure comprises a plurality of channel layers interleaved by a plurality of sacrificial layers, and
      a dummy gate stack extending along a second direction perpendicular to the first direction and disposed over a channel region of the fin-shaped structure;
   depositing a first dielectric layer between the fin-shaped structure and the first dielectric fin and between the fin-shaped structure and the second dielectric fin;
   etching a source/drain region of the fin-shaped structure to form a source/drain trench to expose sidewalls of the plurality of channel layers and the plurality of sacrificial layers;
   forming a dummy source/drain feature in the source/drain trench;
   after the forming of the dummy source/drain features, replacing the dummy gate stack with a metal gate structure;
   after the replacing, removing the dummy source/drain feature from the source/drain trench;
   forming a plurality of thin epitaxial layers over end surfaces of the plurality of channel layers; and
   forming a metal feature in the source/drain trench, wherein the metal feature is in contact with the first dielectric layer.

2. The method of claim 1, further comprising:
before the forming of the dummy source/drain feature, selectively recessing end surfaces of the plurality of sacrificial layers in the channel region to form inner spacer recesses; and
forming inner spacer features in the inner spacer recesses.

3. The method of claim 1, further comprising:
before the forming of the metal feature, forming a plurality of silicide features over surfaces of the plurality of thin epitaxial layers.

4. The method of claim 1, wherein the replacing comprises:
removing the dummy gate stack;
selectively removing the plurality of sacrificial layers in the channel region to release the plurality of channel layers as channel members; and
forming the metal gate structure to wrap around each of the channel members.

5. The method of claim 1, wherein the dummy source/drain feature comprises silicon germanium (SiGe).

6. The method of claim 5, wherein the dummy source/drain feature comprises a germanium content between about 20% and about 60%.

7. The method of claim 1, wherein the fin-shaped structure is disposed over a base fin structure embedded in an isolation feature.

8. The method of claim 7, wherein the first dielectric fin and the second dielectric fin extend partially into the isolation feature.

9. The method of claim 7, wherein a composition of the isolation feature is different from a composition of the first dielectric fin and the second dielectric fin.

10. The method of claim 1, wherein each of the plurality of thin epitaxial layers has a thickness between about 3 nm and about 10 nm.

11. A method, comprising:
receiving a workpiece comprising:
a base fin embedded in an isolation feature,
a fin-shaped structure disposed on the base fin, wherein the fin-shaped structure comprises a plurality of channel layers inter leaved by a plurality of sacrificial layers and includes a channel region and a source/drain feature, and
a dummy gate stack disposed over the channel region;
etching the source/drain region to form a source/drain trench;
forming a dummy source/drain feature in the source/drain region;
removing the dummy gate stack;
selectively removing the plurality of sacrificial layers in the channel region to release the plurality of channel layers as channel members;
forming a gate structure to wrap around each of the channel members;
after the forming of the gate structure, removing the dummy source/drain feature;
forming a plurality of thin epitaxial layers over end surfaces of the plurality of channel members; and
forming a metal feature in the source/drain trench.

12. The method of claim 11, further comprising:
before the forming of the dummy source/drain feature, selectively recessing end surfaces of the plurality of sacrificial layers in the channel region to form inner spacer recesses; and
forming inner spacer features in the inner spacer recesses.

13. The method of claim 11, further comprising:
before the forming of the metal feature, forming a plurality of silicide features over surfaces of the plurality of thin epitaxial layers.

14. The method of claim 11,
wherein the dummy source/drain feature comprises silicon germanium (SiGe),
wherein the dummy source/drain feature comprises a germanium content between about 20% and about 60%.

15. A method, comprising:
forming on a substrate a stack comprising a plurality of first semiconductor layers interleaved by a plurality of second semiconductor layers;
forming a fin structure from the stack;
forming a first dielectric fin and a second dielectric fin such that the fin structure is disposed between the first dielectric fin and the second dielectric fin;
etching a source/drain trench to expose sidewalls of the plurality of first semiconductor layers and the plurality of second semiconductor layers;
selectively recessing the plurality of second semiconductor layers in the fin structure to form inner spacer recesses;
forming inner spacer features in the inner spacer recesses;
selectively depositing an epitaxial layer on the plurality of first semiconductor layers exposed in the source/drain trench;
forming a metal silicide layer on the epitaxial layer; and
depositing a metal source/drain feature in the source/drain trench such that the metal source/drain feature is in contact with the inner spacer features and the metal silicide layer.

16. The method of claim 15, further comprising:
after the etching of the source/drain trench, depositing a placeholder epitaxial feature in the source/drain trench;
depositing an interlayer dielectric layer over the substrate;
forming a source/drain contact opening to expose the placeholder epitaxial feature; and
after forming the source/drain contact opening, removing the placeholder epitaxial feature in the source/drain trench.

17. The method of claim 16, wherein the placeholder epitaxial feature comprises silicon and germanium.

18. The method of claim 15, wherein the metal silicide layer comprises titanium silicide, nickel silicide, or cobalt silicide.

19. The method of claim 15, wherein the metal source/drain feature comprises cobalt (Co), ruthenium (Ru), or tungsten (W).

20. The method of claim 15, wherein the selectively depositing of the epitaxial layer comprises depositing the epitaxial layer to a thickness between about 3 nm and about 10 nm.

* * * * *